(12) United States Patent
Kehrer et al.

(10) Patent No.: US 9,203,451 B2
(45) Date of Patent: Dec. 1, 2015

(54) SYSTEM AND METHOD FOR AN RF RECEIVER

(75) Inventors: Daniel Kehrer, Sauerlach (DE); Kai Jung, Munich (DE)

(73) Assignee: Infineon Technologies AG, Neubiberg (DE)

( * ) Notice: Subject to any disclaimer, the term of this patent is extended or adjusted under 35 U.S.C. 154(b) by 746 days.

(21) Appl. No.: 13/325,935

(22) Filed: Dec. 14, 2011

(65) Prior Publication Data

US 2013/0154868 A1 Jun. 20, 2013

(51) Int. Cl.
*H04B 1/00* (2006.01)
*H04B 1/10* (2006.01)
*H04B 1/18* (2006.01)
*H03H 7/01* (2006.01)

(52) U.S. Cl.
CPC .............. *H04B 1/1036* (2013.01); *H04B 1/109* (2013.01); *H04B 1/18* (2013.01); *H03H 7/0115* (2013.01); *H03H 7/1758* (2013.01); *H03H 7/1766* (2013.01)

(58) Field of Classification Search
USPC .......... 455/334, 339, 341, 307, 73, 78, 552.1, 455/550.1, 503, 507, 77; 333/132, 133, 333/205, 189, 187, 195, 193, 188; 342/16
See application file for complete search history.

(56) References Cited

U.S. PATENT DOCUMENTS

| | | | |
|---|---|---|---|
| 4,268,809 A * | 5/1981 | Makimoto et al. | 333/202 |
| 6,711,395 B1 * | 3/2004 | Tonegawa et al. | 455/313 |
| 6,992,545 B2 | 1/2006 | Spiegel et al. | |
| 6,992,549 B2 | 1/2006 | Higgins | |
| 6,998,938 B2 * | 2/2006 | Lin et al. | 333/177 |
| 7,057,472 B2 | 6/2006 | Fukamachi et al. | |
| 7,366,486 B2 * | 4/2008 | Vorenkamp et al. | 455/182.3 |
| 7,444,166 B2 | 10/2008 | Sahota | |
| 7,653,118 B1 * | 1/2010 | Whelan et al. | 375/139 |
| 7,706,769 B2 | 4/2010 | Perkins | |
| 2003/0058063 A1 * | 3/2003 | Sheen | 333/132 |
| 2003/0090338 A1 * | 5/2003 | Muramatsu | 333/133 |
| 2003/0143949 A1 | 7/2003 | Karabinis | |
| 2004/0266378 A1 * | 12/2004 | Fukamachi et al. | 455/188.1 |
| 2005/0121413 A1 | 6/2005 | Weekamp | |

(Continued)

FOREIGN PATENT DOCUMENTS

| | | |
|---|---|---|
| CN | 1799203 A | 7/2006 |
| CN | 1918805 A | 2/2007 |

(Continued)

OTHER PUBLICATIONS

Daeche, et al., "An Environmentally Friendly, Low Cost, Leadless Package Concept for RF-MEMS," Infineon Technologies Ag, pp. 207-215.

(Continued)

*Primary Examiner* — Ganiyu A Hanidu
(74) *Attorney, Agent, or Firm* — Slater & Matsil, L.L.P.

(57) ABSTRACT

In accordance with an embodiment, a radio-frequency (RF) front-end for a radio configured to receive an RF signal at a first frequency includes an antenna port configured to be coupled to an antenna, and a notch filter having an input coupled to the antenna port. The notch filter is configured to reject one or more frequencies, such that the first frequency is a harmonic or intermodulation distortion product of the one or more frequencies. The RF front-end also includes a piezoelectric filter having an input coupled to an output of the notch filter and an output configured to be coupled to an RF amplifier. The piezoelectric filter has a pass band comprising the first frequency.

26 Claims, 3 Drawing Sheets

(56) References Cited

U.S. PATENT DOCUMENTS

| | | |
|---|---|---|
| 2006/0006960 A1* | 1/2006 | Lin et al. ............... 333/132 |
| 2006/0009186 A1 | 1/2006 | Liu et al. |
| 2006/0281418 A1* | 12/2006 | Huang et al. ............... 455/78 |
| 2007/0105514 A1* | 5/2007 | Tseng et al. ............... 455/189.1 |
| 2008/0214139 A1 | 9/2008 | Conta et al. |
| 2009/0033805 A1 | 2/2009 | Miyake et al. |
| 2010/0091690 A1 | 4/2010 | Boyle |
| 2010/0167684 A1* | 7/2010 | Kerth ............... 455/339 |
| 2010/0201570 A1 | 8/2010 | Shemar et al. |
| 2010/0225554 A1* | 9/2010 | Huang et al. ............... 343/821 |

FOREIGN PATENT DOCUMENTS

| | | |
|---|---|---|
| CN | 101069360 A | 11/2007 |
| JP | 2005101938 A | 4/2005 |
| KR | 20040023745 A | 3/2004 |

OTHER PUBLICATIONS

"AN11101 BGU7007 GPS front end evaluation board," NXP Semiconductors, Rev. 1-7, Sep. 2011, Jun. 2009, 20 pages.

* cited by examiner

SYSTEM AND METHOD FOR AN RF RECEIVER

TECHNICAL FIELD

This invention relates generally to circuits and methods, and more particularly to a system and method for an RF receiver.

BACKGROUND

The increasing number of frequency bands and standards in mobile communication systems increases the design complexity of mobile phones, as some mobile phones are now configured to operate using multiple standards across multiple frequency bands. In addition, the mobile phone may also include a Global Navigation Satellite System (GNSS) receiver. In many mobile phones, these multiple frequency bands and standards are implemented by using multiple radio frequency (RF) transmitters and receivers within multiple signal paths that may be coupled to one or more antennas.

The introduction of more and more frequency bands within the mobile phone, however, may cause some issues with respect to jamming due to the creation of distortion products within circuitry of the mobile phone, in that some systems within the mobile phone may transmit and receive simultaneously, or some systems in the mobile phone may transmit while others are receiving. For example, transmitted energy from a UMTS/LTE transceiver may produce intermodulation products and harmonics that are coupled into the receive path of a GNSS receiver, and may adversely affect the performance of the GNSS receiver. Because the GNSS receiver receives low level signals from a GNSS satellite, and because the intermodulation products and harmonics are the result of a local transmission of power from the mobile phone, it does not take much in the way of intermodulation product and harmonic generation to appreciably desensitize the GNSS receiver.

SUMMARY OF THE INVENTION

In accordance with an embodiment, a radio-frequency (RF) front-end for a radio configured to receive an RF signal at a first frequency includes an antenna port configured to be coupled to an antenna, and a notch filter having an input coupled to the antenna port. The notch filter is configured to reject one or more frequencies, such that the first frequency is a harmonic or intermodulation distortion product of the one or more frequencies. The RF front-end also includes a piezoelectric filter having an input coupled to an output of the notch filter and an output configured to be coupled to an RF amplifier. The piezoelectric filter has a pass band comprising the first frequency.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, an RF front-end module for a GNSS receiver in a mobile phone system. Embodiment GNSS receivers may support one or more of the various navigation systems including, but not limited to Global Positioning System (GPS), Globalnaya Navigatsionnaya Sputnikovaya Sistema (GLONASS), and Galileo. The invention may also be applied to RF circuits for other system and receiver types, and to other circuits and systems in which harmonic and intermodulation distortion is managed.

State-of-the-art cell phones may be multi-system and multiband devices that support varying standards such as CDMA, TDMA, GSM, UMTS/LTE, Bluetooth, and Wi-Fi, and transmit over the varying frequency bands over which these standards operate. In some cases, transceivers may transmit over these multiple bands simultaneously, such that transmitted energy coupled into a receive path of the GNSS receiver may produce intermodulation products and harmonics due to nonlinearities within the transmit path of the respective transceivers and due to due to nonlinearities within the GNSS receive path itself.

Figure 1:
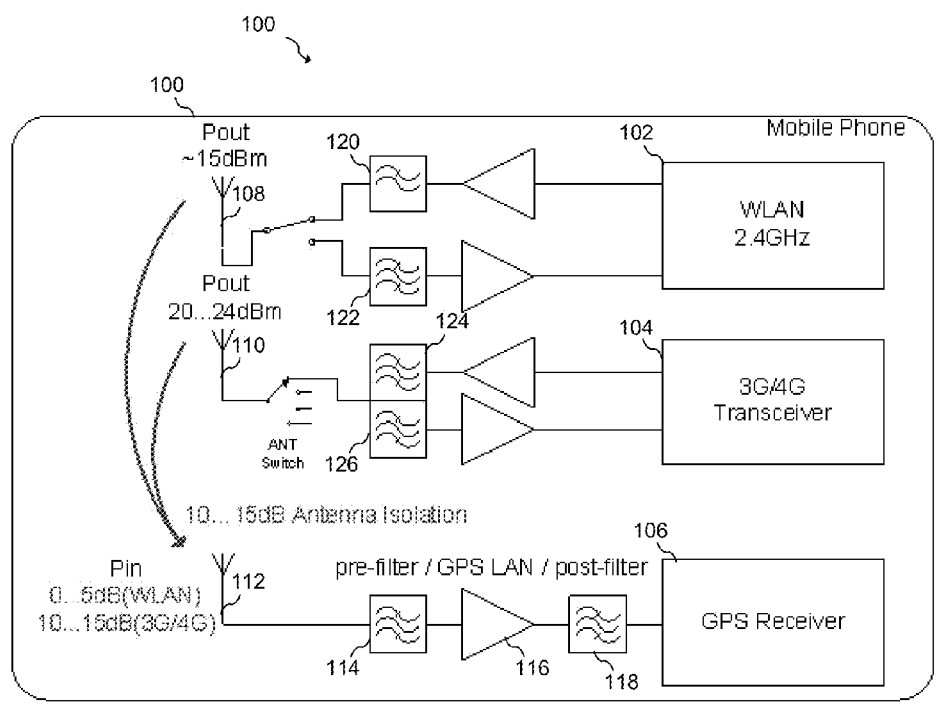
FIG. 1 illustrates a conventional multi-band mobile phone system.

FIG. 1 illustrates a block diagram of conventional multi-band mobile phone 100. Mobile phone 100 has wireless LAN system 102 coupled to antenna 108, 3G/4G transceiver 104 coupled to antenna 110, and GNSS receiver 106 coupled to antenna 112. The GNSS signal path may include pre-filter 114, low noise amplifier (LNA) 116, post filter 118, and GNSS receiver 106. Signals transmitted by wireless LAN system 102 and signals transmitted by 3G/4G transceiver 104 are coupled into antenna 112 of the GNSS receiver. As such, wireless LAN transceiver 102 and 3G/4G transceiver 104 utilize filters 120, 122, 124, and 126, to limit the generation and reception of out of band signals.

In band signals, however, are coupled to GNSS antenna 112. Even though there may be between 10 dB and 15 dB of antenna isolation between the antennas 108, 110 and 112, there still may be appreciable power received by GNSS antenna 112. For example, antenna 112 may receive between 0 and 5 dBm of power in the wireless LAN transmission band, and between 10 dBm and 15 dBm of power within the 3G/4G transmission band. The power typically received by the GNSS receiver, however, is about −127 dBm. It should therefore be appreciated that interference may be created within the GNSS receive band from harmonics and intermodulation distortion products generated from signals received by the GNSS receiver from transmitters present on the cell phone.

In one illustrative example, when a mobile device simultaneously transmits signals at f1=2402 MHz (lower frequency of Bluetooth or IEEE802.11g band) and f2=827 MHz (part of LTE band 5), the IMD2 product of f1−f2=1575 MHz falls within the GNSS frequency band. The same problem occurs when transmitting in LTE band 8 and Bluetooth/WLAN simultaneously. For example, if f1=2480 MHz (upper frequency of Bluetooth or IEEE802.11g band) and f2=905 MHz (part of LTE band 8), the resulting IM2 product also falls at 1575 MHz. Furthermore, a cell phone using LTE Band 13 may transmit power at frequency f1=787 MHz. When coupled into the GNSS Path, the 2nd harmonic at 2*f1=1574 MHz is generated, and may interfere with the GNSS frequency band and harm the sensitivity of the GNSS receiver.

Generally, jammer signals and interfering signals are blocked using pre-filter 114, which may be a SAW, BAW or FBAR device. Post-filter 118 is also provided to remove noise and out-of-band signals, such as noise and distortion produced by LNA 116 prior to downconversion by GNSS receiver 106. It should be appreciated, however, that not only may low noise amplifier (LNA) generate distortion, but pre-filter 114 may also generate harmonics and IMD products that limit the performance of subsequent components. When using multi-system antennas, transmitted power may be directly coupled into the GNSS path if there is no additional signal separation to prevent higher losses and increased noise figure.

In an embodiment, the signal level of unwanted frequencies that may generate intermodulation distortion and harmonics are reduced by filtering these unwanted frequencies. In one embodiment, this filtering is achieved by using an LC filter circuit with one or more resonant filters in a defined topology in front of the pre-filter in the GNSS receive path. The inductor and capacitor values are chosen such that the resonant filters notch out frequency bands that have the potential of generating intermodulation distortion products and harmonics within the GNSS frequency band.

Figure 2:
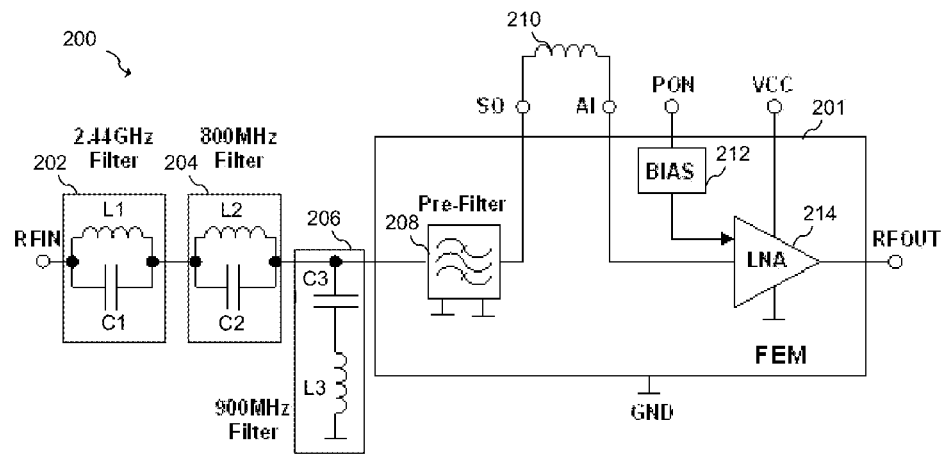
FIG. 2 illustrates a front-end module according to an embodiment of the present invention.

FIG. 2 illustrates GNSS RF front-end system 200 according to an embodiment of the present invention. Front-end system 200 includes pre-filter 208, LNA 214, and lumped element resonator circuits 202, 204, and 206. In addition, inductor 210 may be included in order to match the pre-filter 208 with LNA 214, and bias generator 212 may be used to bias LNA 214. In an embodiment, some elements of RF front-end system 200 may reside on module 201, and other components may reside on components that are external to module 201. For example, inductor 210 and lumped element resonator circuits 202, 204, and 206 may be external to module 201 and may be implemented using printed inductors and/or surface mount passive components such as surface mount device (SMD) inductors and capacitors. In alternative embodiments, some or all of these elements may be included on the module.

In one embodiment, three resonant LC circuits are used to attenuate signals received from other transmitters on the mobile phone. The values for L1 and C1 in resonant circuit 202 are chosen to attenuate a frequency of about 2.4 GHz. Resonant circuit 204 is configured to have a notch center frequency of about 800 MHz, and resonant circuit 206 is configured to have a notch center frequency of about 900 MHz in order to reject LTE band 5, band 8, and band 13 in a range of about 707 MHz to approximately 900 MHz. In this embodiment, a combination of two resonant filters 204 and 206 are used not only to provide rejection over a wider frequency range, but also to provide more attenuation to these frequencies. In an embodiment, resonator circuits 202, 204, and 206 attenuate the low band signal level at about 800 MHz, attenuates the high band 2.4 GHz jammer, while providing minimum insertion loss for the GNSS or GPS band. In an embodiment, the following values are used for resonant filters 202, 204 and 206: L1=1.5 nH; C1=3.0 pF; L2=6.2 nH; C2=5.6 pF; L3=12 nH; and C3=3.9 pF. it should be appreciated that these values are example values representing one specific embodiment. Alternatively, other values may be used. In the embodiment illustrated in FIG. 2, resonators 202 and 204 are implemented as parallel resonant circuits, and resonator 206 is implemented as a series resonant circuit. It should be appreciated that in alternative embodiments, any combination of parallel and series resonant circuits may be used at varying frequencies.

By using resonant circuits 202, 204 and 206, unwanted signals are attenuated before the pre-filter (SAW, BAW, FBAR) and thus the IMD2 products and harmonics generated in the pre-filter and all subsequent blocks are lowered significantly. Furthermore, the filter circuit provides high impedance for the 2.4 GHz band as well as for LTE Bands 5, 8, 13 so performance of these bands are maintained in the case where the GNSS or GPS receive path shares an antenna with the rest of the system via a multi-system antenna.

In an embodiment, first filter stage 202 is a parallel resonant circuit with $$f1 = \frac{1}{2\pi\sqrt{LC}} = 2.44 \text{ GHz},$$

whereby the decreasing inductance and increasing capacitance above center frequency f1 reduces the insertion loss in the GNSS band. In the presence of a 2.4 GHz system (e.g. Bluetooth, WLAN) in the same antenna path, the notch filter provides a high input impedance for this frequency band so it will not affect the antenna performance within the 2.4 GHz frequency band. In an embodiment, an additional transmission line may be provided in front of the filter to transform its desired high input impedance to an unwanted low impedance or short. Due to its shorter wavelength compared to the 800 MHz band, the 2.4 GHz input impedance may be more sensitive to transmission line transformation. For this reason, the 2.4 GHz notch filter is placed at the first position of the multi frequency notch filter circuit in some embodiments. In some embodiments, the position of the resonator circuit is dependent on its sensitivity to transmission line transformations. Therefore, the most sensitive circuits are placed closer to the RF input, and the least sensitive circuits are placed farther from the RF input. In other embodiments however, the filters may be ordered differently.

Depending on the low frequency bands supported by the cell phone, second parallel notch filter 204 and series resonator 206 may be tuned to different frequencies in order to cover the whole frequency range. In an embodiment LTE system, using band 5, band 8 and band 13, the parallel notch may be tuned to about $$f2 = \frac{1}{2\pi\sqrt{LC}} = 800 \text{ MHz}$$

and the series notch may be tuned to about $$f3 = \frac{1}{2\pi\sqrt{LC}} = 900 \text{ MHz}$$

in order to reject frequencies between f1 and f2. Higher performance may be achieved by placing resonators 202, 204 and 206 close to front-end module 201.

It should be appreciated that the example shown in FIG. 2 is just one example of many different embodiment topologies. In alternative embodiments, the center frequencies of the various resonant filter circuits may be chosen to attenuate other frequency bands that may produce harmonics or intermodulation distortion products that may fall within the frequency band of interest. Moreover, in alternative embodiments greater or fewer than three resonant circuits may be used.

Figure 3:
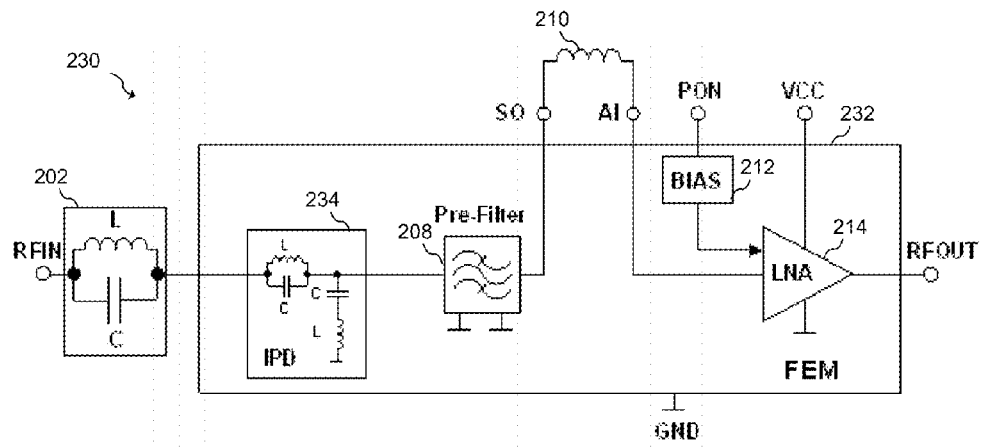
FIG. 3 illustrates a front-end module according to a further embodiment of the present invention.

FIG. 3 illustrates RF front-end system 230 according to a further embodiment of the present invention. RF front-end system 230 includes front-end module 232 on which two resonant filters are implemented on an integrated passive device (IPD) 234. IPD 234 may be implemented, for example, using a silicon die on which only passive devices are fabricated. In other embodiments, IPD 234 may use other substrate materials, and/or may include other active or passive circuit components. In a further embodiment, the resonators on IPD 234 may be implemented directly on the substrate of module 232 using traces or layers of the substrate of module 232. Alternatively, resonators may be mounted as passive devices on the substrate of module 232. In the embodiment of FIG. 3, resonator 202 is implemented off of module 232 to increase flexibility on the target application. Resonator 202 may be tuned to 2.4 GHz or 800 MHz depending on the particular application and on the resonators implemented on IPD 234 Alternatively, resonator 202 may also be implemented on module 232, either directly on the substrate of module 232 or on IPD 234.

In other embodiments, module 201 may be implemented on a ceramic substrate on which pre-filter 208, bias generator 212, and LNA 214 is mounted. Also, the module 232 may be implemented on a ceramic substrate including IPD 234, pre-filter 208, bias generator 212 and LNA 214, as well as a post filter coupled to the output of LNA 214 (not shown) in some embodiments. Moreover, pre-filter 208 may be implemented using a piezoelectric filter having a passband within the GNSS frequency range. An embodiment piezoelectric filter may include, but is not limited to, a surface acoustic wave (SAW) filter, a bulk acoustic wave (BAW) filter, a thin film bulk acoustic resonator (FBAR) filter, or a ceramic filter.

Figure 4:
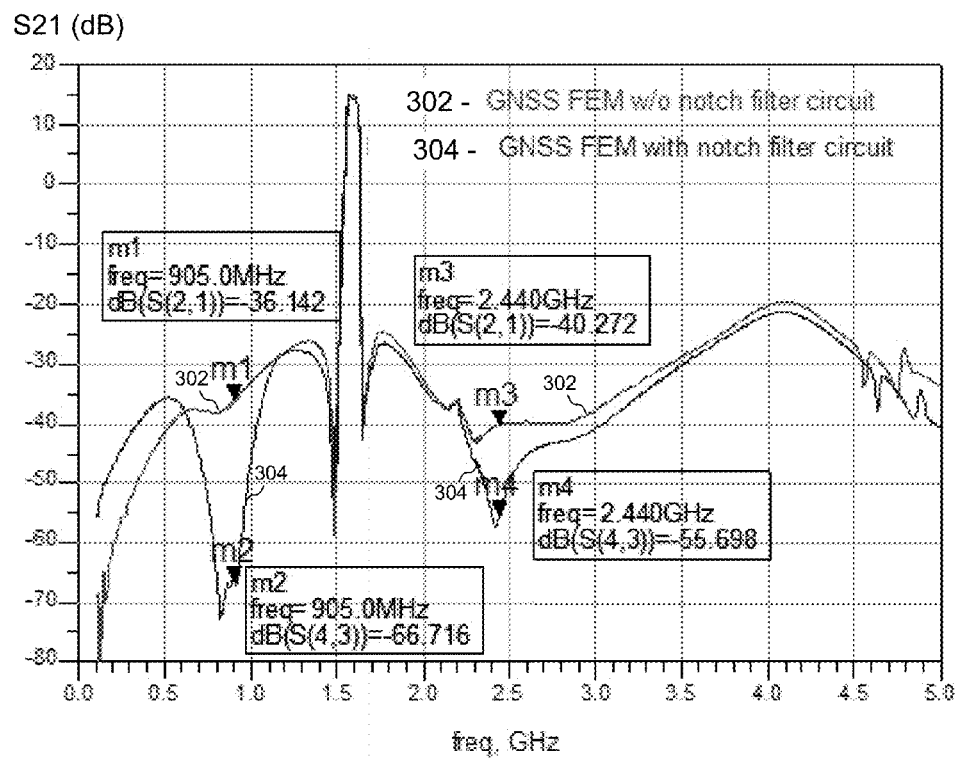
FIG. 4 illustrates a graph showing the transmission loss of an embodiment system.

FIG. 4 illustrates graphs of insertion loss S21 versus frequency for front-end modules in a leadless TSNP leadframe with and without embodiment notch filter circuits. It can be seen that trace 302 representing the insertion loss of a front-end module without the embodiment notch filter circuit has more than 30 dB less attenuation for frequencies between 800 MHz and 900 MHz then trace 304 representing the insertion loss of the front-end module having an embodiment notch filter circuit. At 2.4 GHz, the embodiment circuit provides about 15 dB more attenuation then the front-end module without the notch filter. It should be appreciated that alternative embodiments may have different performance characteristics than those shown in the graph of FIG. 4. It should be further appreciated that other lead frame types may be used in alternative embodiments. Moreover, embodiments of the present invention may include leaded and/or leadless packages.

Figure 5:
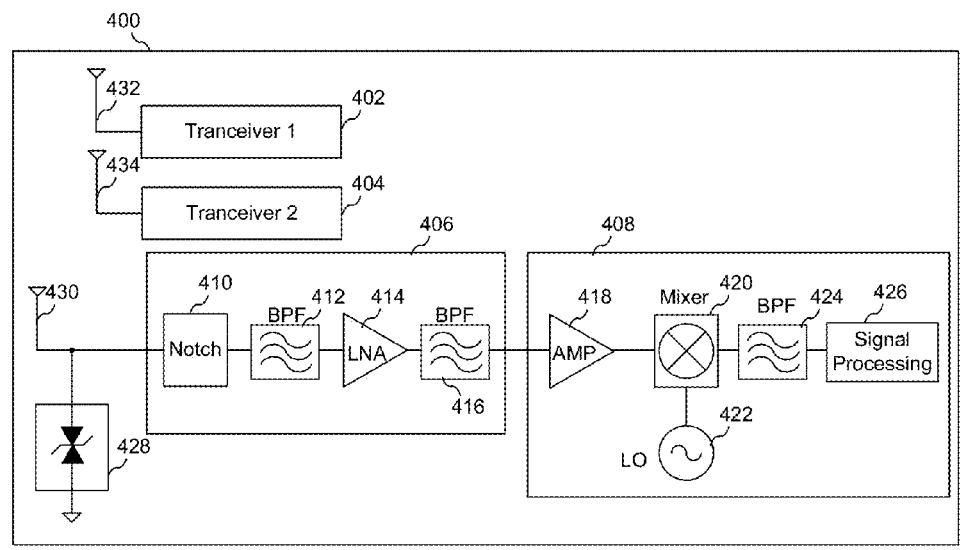
FIG. 5 illustrates an embodiment mobile phone system.

Turning to FIG. 5, mobile phone 400 according to an embodiment of the present invention is shown. Mobile phone 400 has transceiver 402 coupled to antenna 432, transceiver 404 coupled to antenna 434, GNSS front end 406 coupled to antenna 430, and GNSS receiver 408 coupled to an output of GNSS front-end 406. Transceivers 402 and 404 may operate according to various wireless network and wireless telecommunication standards. In some embodiments of the present invention, transceivers 402 and 404 may be coupled to a same antenna, and/or may be coupled to antenna 430, or the same antenna used by the GNSS receiver. RF front-end module 406 has embodiment notch filter 410, and pass filter 412, low noise amplifier 414, and bandpass filter 416. Notch filter 410 may be implemented according to embodiments described herein. GNSS receiver 408 has amplifier 418, mixer 420, local oscillator 422, bandpass filter 424, and signal processor 426. The elements of GNSS receiver 408 operate according to principles known in the art. In some embodiments, electrostatic discharge (ESD) diode 428 may be coupled to antenna 430 and/or the input of RF front-end module 406 in order to provide electrostatic discharge protection.

In an embodiment, a radio frequency front-end for a radio configured to receive a radio frequency signal at a first frequency includes an antenna port configured to be coupled to an antenna. The radio frequency front-end also includes a notch filter having input coupled to the antenna port. The notch filters configured to reject one or more frequencies such that the first frequency is a harmonic or intermodulation distortion product of the one or more frequencies. The radio frequency front-end also includes piezoelectric filter having an input coupled to an output of the notch filter and an output configured to be coupled to an radio frequency amplifier the piezoelectric filter has a passband that includes the first frequency in an embodiment the radio frequency front-end also includes a low noise amplifier having an input coupled to an output of the piezoelectric filter. The piezoelectric filter may comprise a surface acoustic wave (SAW) filter or other type of filter. In some embodiments, the first frequency is a second harmonic of the one or more frequencies.

In some embodiments, the notch filter is a lumped element notch filter. The lumped element notch filter may include a first parallel LC filter coupled in series between the antenna port and the input of the piezoelectric filter. In some embodiments, the lumped element notch filter further includes a series LC tank coupled between the input of the piezoelectric filter and a reference voltage. The first parallel LC tank may include a first end coupled to the antenna port and a second end coupled to the input of the piezoelectric filter. The series LC tank is coupled between the second end of the first parallel LC tank and the reference voltage in some embodiments. The series LC tank may include a different center frequency from the first parallel LC tank. These center frequencies may be chosen in order to provide attenuation to a band of frequencies. In some embodiments, the lumped element notch filter may include discrete inductors and capacitors coupled to a circuit board. The lumped element notch filter may be disposed on an integrated passive die. In some embodiments, the first frequency is in a GNSS frequency band, such as a GPS, GLONASS or Galileo frequency band. Moreover, in some embodiments, the lumped element notch filter presents a high impedance to the antenna port within a cellular communication band or within in a wireless LAN band.

In an embodiment, a radio frequency front end module includes a lumped element notch filter having an input coupled to an input port of the front-end module, wherein the lumped element notch filter is configured to reject a first frequency. The front-end module also includes a piezoelectric filter having an input coupled to an output of the lumped element notch filter. The piezoelectric filter may have a passband that includes a second frequency, or the second frequency is a harmonic of the first frequency. The front end module also includes a radio frequency amplifier coupled to an output of the piezoelectric filter. In some embodiments, the second frequency is a second harmonic of the first frequency. The piezoelectric filter may include a surface acoustic wave filter.

In some embodiments, the lumped element notch filter includes a parallel resonant LC tank having a first end coupled to the input port and a second end coupled to an input of the RF amplifier. The front-end module may also include a series resonant LC tank having a first end coupled to the second end of the parallel resonant LC tank and a second end coupled to a reference voltage. The parallel resonant LC tank and the series resonant LC tank may comprise discrete in doctors and capacitors in some embodiments. Alternatively, the parallel resonant LC tank and/or the series resonant LC tank may be integrated in an integrated passive die. In some embodiments, the front-end module is a front-end module for a global positioning system receiver.

In an embodiment, a radio frequency (RF) system includes a lumped element notch filter having an input coupled to an input port of the RF system. The lumped element notch filter is configured to reject one or more frequencies. The radio frequency system also includes a piezoelectric filter having an input coupled to an output of the lumped element notch filter. The piezoelectric filter further has a past band that includes a second frequency, for the second frequency is a harmonic or intermodulation distortion product of the one or more frequencies. Furthermore, and RF amplifier is coupled to an output of the piezoelectric filter. In some embodiments, the lumped element notch filter includes a parallel LC tank having a first end coupled to the input port and a second end coupled to an input of the RF amplifier. The lumped element notch filter may further include a series resonant LC tank having a first end coupled to the second end of the parallel resonant LC tank and a second end coupled to a reference voltage.

In some embodiments, the system also includes a radio receiver coupled to an output of the RF amplifier. Furthermore, the radio receiver may be a GNSS receiver, such as a GPS, GLONASS or Galileo receiver.

In an embodiment of the present invention, a method of processing a radio frequency (RF) signal at a first frequency includes receiving the RF signal, notch filtering the RF signal at one or more frequencies using a lumped element notch filter to produce a first filtered signal. The method also includes filtering the first filtered signal with the piezoelectric filter to produce a second filtered signal. The piezoelectric filter may have a passband including a second frequency, wherein the second frequency is a harmonic or intermodulation distortion product of the one or more frequencies. The second filter signal is then amplified with an RF amplifier.

In an embodiment, notch filtering the RF signal at the one or more frequencies using the lumped element notch filter includes filtering with a parallel resonant LC tank having a first end coupled to an input to a system, and a second end coupled to an input of the RF amplifier, and filtering with a series resonant LC tank having a first end coupled to the second end of the parallel resonant LC tank and a second end coupled to a reference voltage.

Advantages of embodiments of the present invention include the ability to maintain high sensitivity to GNSS signals in the presence of active transmitters in a multiband mobile phone system. Another advantage of embodiments of the present invention is that high-performance may be achieved by using relatively inexpensive conductive and capacitive components. Further advantages include the fact that some embodiment front-ends present a high impedance to the antenna in cellular communication bands and in wireless LAN bands to the antenna so as not to load down these bands in the rest of the system.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A radio-frequency (RF) front-end for a radio configured to receive an RF signal at a first frequency, the RF front-end comprising:
    an antenna port configured to be coupled to an antenna;
    a notch filter having an input coupled to the antenna port, the notch filter configured to reject one or more frequencies, wherein the first frequency is a harmonic or intermodulation distortion product of the one or more frequencies; and
    a piezoelectric filter having an input coupled to an output of the notch filter and an output configured to be coupled to an RF amplifier, the piezoelectric filter having a pass band comprising the first frequency, wherein
    the notch filter comprises a lumped element notch filter having a first parallel LC tank coupled in series between the antenna port and the input of the piezoelectric filter and a series LC tank coupled between the input of the piezoelectric filter and a reference voltage,
    the first parallel LC tank comprises a first end coupled to the antenna port and a second end coupled to the input of the piezoelectric filter, and
    the series LC tank is coupled between the second end of the first parallel LC tank and the reference voltage.

2. The RF front-end of claim 1, further comprising a low-noise amplifier (LNA) having an input coupled to an output of the piezoelectric filter.

3. The RF front-end of claim 1, wherein the series LC tank comprises a different center frequency from the first parallel LC tank.

4. The RF front-end of claim 1, wherein the lumped element notch filter comprises one or more discrete inductors and capacitors coupled to a circuit board.

5. The RF front-end of claim 1, wherein the lumped element notch filter is disposed on an integrated passive die (IPD).

6. The RF front-end of claim 1, wherein the first frequency is in a Global Navigation Satellite System (GNSS) frequency band.

7. The RF front-end of claim 1, wherein the piezoelectric filter comprises a surface acoustic wave (SAW) filter.

8. The RF front-end of claim 1, wherein the first frequency is a second harmonic of the one or more frequencies.

9. The RF front-end of claim 1, wherein the notch filter presents a high impedance to the antenna port within a cellular communication band or within in a wireless LAN band.

10. A radio-frequency (RF) front-end module comprising:
    a lumped element notch filter having an input coupled to an input port of the front-end module, the lumped element notch filter configured to reject a first frequency;
    a piezoelectric filter having an input coupled to an output of the lumped element notch filter, the piezoelectric filter having a pass band that includes a second frequency, the second frequency being a harmonic of the first frequency; and an RF amplifier coupled to an output of the piezoelectric filter, wherein the lumped element notch filter comprises
a parallel resonant LC tank having a first end coupled to the input port and a second end coupled to an input of the RF amplifier, and
a series resonant LC tank having a first end coupled to the second end of the parallel resonant LC tank and a second end coupled to a reference voltage.

11. The front-end module of claim 10, wherein the second frequency is a second harmonic of the first frequency.

12. The front-end module of claim 10, wherein the piezoelectric filter comprises a surface acoustic wave (SAW) filter.

13. The front-end module of claim 10, wherein the parallel resonant LC tank and the series resonant LC tank comprise discrete inductors and capacitors.

14. The front-end module of claim 10, wherein the parallel resonant LC tank and the series resonant LC tank is integrated in an integrated passive die (IPD).

15. The front-end module of claim 10, wherein the front-end module is a front-end module for a Global Navigation Satellite System (GNSS) receiver.

16. The front-end module of claim 15, wherein the GNSS receiver is a Global Positioning System (GPS) receiver.

17. A radio frequency system (RF) comprising:
a lumped element notch filter having an input coupled to an input port of the RF system, the lumped element notch filter configured to reject one or more frequencies;
a piezoelectric filter having an input coupled to an output of the lumped element notch filter, the piezoelectric filter having a pass band that includes a second frequency, the second frequency being a harmonic or intermodulation distortion product of the one or more frequencies; and
an RF amplifier coupled to an output of the piezoelectric filter, wherein the lumped element notch filter comprises
a parallel resonant LC tank having a first end coupled to the input port and a second end coupled to an input of the RF amplifier, and
a series resonant LC tank having a first end coupled to the second end of the parallel resonant LC tank and a second end coupled to a reference voltage.

18. The RF system of claim 17, further comprising a radio receiver coupled to an output of the RF amplifier.

19. The RF system of claim 18, wherein the radio receiver comprises a Global Navigation Satellite System (GNSS) receiver.

20. A method of processing a radio frequency (RF) signal at a first frequency, the method comprising:
receiving the RF signal;
notch filtering the RF signal at one or more frequencies using a lumped element notch filter to produce a first filtered signal;
filtering the first filtered signal with a piezoelectric filter to produce a second filtered signal, the piezoelectric filter having a passband including a second frequency, wherein the second frequency is a harmonic or intermodulation distortion product of the one or more frequencies; and
amplifying the second filtered signal with an RF amplifier, wherein notch filtering the RF signal at the one or more frequencies using the lumped element notch filter comprises filtering with a parallel resonant LC tank having a first end coupled to an input to a system, and a second end coupled to an input of the RF amplifier, and filtering with a series resonant LC tank having a first end coupled to the second end of the parallel resonant LC tank and a second end coupled to a reference voltage.

21. The RF front-end of claim 1, further comprising a second parallel LC tank coupled between the antenna port and the first parallel LC tank.

22. The RF front-end of claim 21, wherein:
the first parallel LC tank has a resonant frequency of about 800 MHz;
the first parallel LC tank has a resonant frequency of about 2.44 GHz; and
the series LC tank has a resonant frequency of about 900 MHz.

23. The RF front-end of claim 5, wherein
the piezoelectric filter is integrated on the IPD and has an input coupled an output of the lumped element notch filter and an output coupled to a first terminal of the IPD; and
the IPD further comprises a low noise amplifier (LNA) having an input coupled to a second terminal of the IPD.

24. The RF front-end of claim 23, further comprising an external inductor coupled between the first terminal of the IPD and the second terminal of the IPD.

25. The front-end module of claim 10, further comprising a further parallel LC tank coupled between the input port and the parallel resonant LC tank.

26. The RF system of claim 17, further comprising a further parallel LC tank coupled between the input port and the parallel resonant LC tank.

* * * * *